(12) United States Patent
Candra et al.

(10) Patent No.: US 8,618,583 B2
(45) Date of Patent: Dec. 31, 2013

(54) JUNCTION GATE FIELD EFFECT TRANSISTOR STRUCTURE HAVING N-CHANNEL

(75) Inventors: Panglijen Candra, Essex Junction, VT (US); Richard A. Phelps, Colchester, VT (US); Robert M. Rassel, Colchester, VT (US); Yun Shi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 13/108,305

(22) Filed: May 16, 2011

(65) Prior Publication Data

US 2012/0292669 A1 Nov. 22, 2012

(51) Int. Cl.
*H01L 29/66* (2006.01)
*H01L 21/70* (2006.01)
*H01L 21/337* (2006.01)

(52) U.S. Cl.
USPC .......... 257/268; 257/256; 257/264; 257/267; 257/269; 257/281; 257/285; 257/504; 257/E27.148; 438/186; 438/194; 438/196

(58) Field of Classification Search
USPC .......................................... 438/186, 194, 196
See application file for complete search history.

(56) References Cited

U.S. PATENT DOCUMENTS

| | | | |
|---|---|---|---|
| 5,378,642 A * | 1/1995 | Brown et al. | 438/186 |
| 5,637,898 A | 6/1997 | Baliga | |
| 6,271,550 B1 | 8/2001 | Gehrmann | |
| 6,486,011 B1 | 11/2002 | Yu | |
| 6,693,314 B2 | 2/2004 | Mitlehner et al. | |
| 7,638,379 B2 | 12/2009 | Cheng et al. | |
| 7,667,268 B2 * | 2/2010 | Disney et al. | 257/335 |
| 7,670,889 B2 | 3/2010 | Pekarik et al. | |
| 2008/0001183 A1 | 1/2008 | Kapoor | |
| 2008/0067560 A1 | 3/2008 | Knaipp | |
| 2008/0128762 A1 * | 6/2008 | Vora | 257/288 |
| 2009/0101941 A1 | 4/2009 | Ellis-Monaghan et al. | |
| 2009/0206375 A1 * | 8/2009 | Saha et al. | 257/281 |
| 2010/0207173 A1 | 8/2010 | Anderson et al. | |
| 2012/0168820 A1 * | 7/2012 | Liu et al. | 257/192 |

* cited by examiner

*Primary Examiner* — Michael Jung
(74) *Attorney, Agent, or Firm* — Michael J. LeStrange; Hoffman Warnick LLC

(57) ABSTRACT

The disclosure relates generally to junction gate field effect transistor (JFET) structures and methods of forming the same. The JFET structure includes a p-type substrate having a p-region therein; an n-channel thereunder; and n-doped enhancement regions within the n-channel, each n-doped enhancement region separated from the p-region.

20 Claims, 9 Drawing Sheets

JUNCTION GATE FIELD EFFECT TRANSISTOR STRUCTURE HAVING N-CHANNEL

TECHNICAL FIELD

The disclosure relates generally to a field effect transistor (FET) structure and a method of forming the same, and more particularly, to vertical junction gate field effect transistor (JFET) structure and a method of forming the same.

BACKGROUND

A junction gate field effect transistor (JFET) is a type of field effect transistor typically used in low-noise, high input-impedance op-amps and in switching applications. A JFET can offer faster switching speed than bipolar transistors since the JFET is a majority carrier device. Voltage characteristics of a JFET make it a candidate for certain applications such as power amplifiers.

SUMMARY

An aspect of the present invention relates to a junction gate field effect transistor (JFET) comprising: a p-type substrate having a p-region therein; an n-channel under the p-region; and n-doped enhancement regions within the n-channel, each n-doped enhancement region separated from the p-region.

A second aspect of the present invention relates to a junction gate field effect transistor (JFET) comprising: a p-type substrate having an n-well therein; a p-well abutting the n-well and abutting a deep n-region of the n-well, wherein the deep n-region is between the p-well and the substrate, and abuts the n-well; an n-channel abutting the p-well and on a p-region of the p-well, wherein the p-region is between the n-channel and the deep n-region; a p-doped gate on the n-channel; n-doped enhancement regions within the n-channel, each n-doped enhancement region separated from the p-doped gate by a shallow trench isolation; an n-well contact on the n-well; a p-well contact on the p-well and in contact with the p-doped gate; and n-channel contacts on the n-doped enhancement regions, wherein the n-channel contacts are each separated from the p-doped gate and separated from the p-well contact by a shallow trench isolation.

A third aspect of the present invention relates to a method of forming a junction gate field effect transistor (JFET), the method comprising: forming a p-region within a p-type substrate; forming an n-channel over the p-region; and forming enhancement regions within the n-channel, wherein the enhancement regions are separated from the p-region by the n-channel.

A fourth aspect of the present invention relates to a method of forming a junction gate field effect transistor (JFET), the method comprising: forming a deep n-region within a p-type substrate; forming shallow trench isolation (STI) in the p-type substrate; forming an n-well in the p-type substrate, wherein the n-well is in contact with edges of the STI and abuts the deep n-region; forming a p-region above the deep n-region; forming an n-channel on the p-region; forming a p-well in the substrate, wherein the p-well is abutting the n-well and the deep n-region, and in contact with an edge of the p-region and the n-channel; forming an n-well contact on the n-well; forming a p-well contact on the p-well; forming a p-doped gate on the n-channel; forming a pair of enhancement regions in the n-channel; and forming n-channel contacts on the pair of enhancement regions.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

A junction gate field-effect transistor (JFET) typically consists of long channels of semiconductor material doped so that it may retain positive charge carriers or negative charge carriers. In operation, electric current flows from a source to a drain, with a gate determining how much current flows through the device. By applying an increasing negative (for an n-channel JFET) bias voltage to the gate, the current flow from the source to drain can be impeded by pinching off the channel, in effect switching off the JFET.

The behavior may be due to the depletion region of the p-n junction expanding under the influence of a reverse-bias voltage, eventually occupying the entire width of the channel if the voltage is great enough. This operational behavior is opposite of the bipolar junction transistor or standard CMOS enhancement mode MOSFET transistors, which are normally off. JFETs, on the other hand, are normally on devices where no voltage applied to the gate allows maximum current through the source and the drain.

In order to pinch off the channel, it is necessary to produce a certain voltage in a reverse direction (VGS) of the junction. The precise value of this pinch off voltage varies with individual JFETs, with typical values ranging between 0.5 V to 10 V. The appropriate voltage bias can be easily remembered, as the n-channel device requires a negative gate source voltage (VGS) to switch off the JFET.

It has been discovered the resistance-on value of the n-channel region of the JFET may be enhanced, i.e., reduced, by including an n-doped enhancement region therein without significantly increasing the n-channel's voltage off value and at the same time, improving the breakdown performance.

Figure 1:
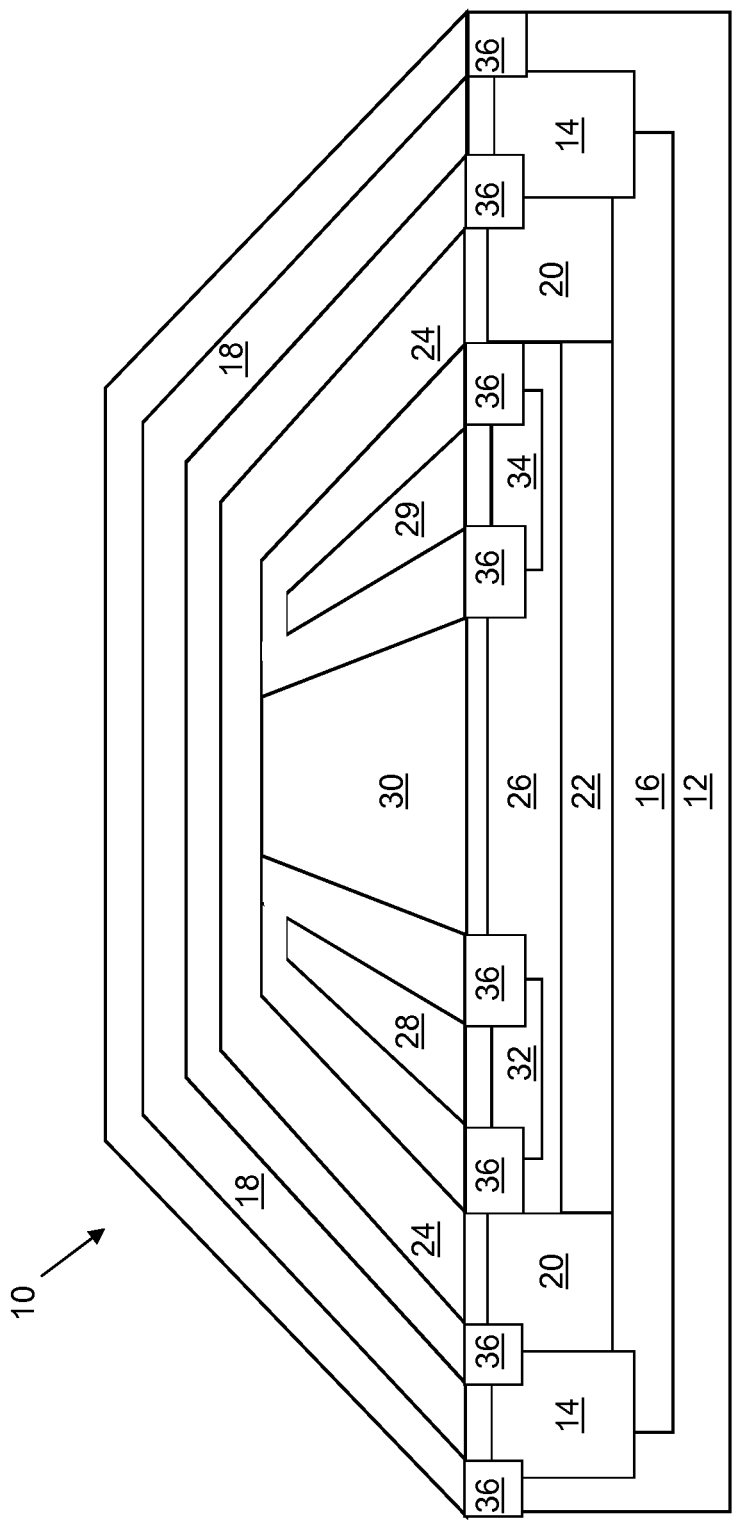
FIG. 1 depicts a cross-sectional, perspective view of an embodiment of a vertical junction gate field effect transistor (JFET), in accordance with the present invention.

A cross-sectional, perspective view of an embodiment of a JFET is presented in FIG. 1, in accordance with the present invention. Referring to FIG. 1, JFET 10 is shown having a substrate 12, an n-well 14, a deep n-region 16, an n-well contact 18, a p-well 20, a p-region 22, a p-well contact 24, an n-channel 26, n-channel contacts 28 and 29, a p-doped gate 30, n-doped enhancement regions 32 and 34, and shallow trench isolations 36 (STI).

Substrate 12 may be a semiconductor substrate comprised of but not limited to silicon, germanium, silicon germanium, silicon carbide, and those consisting essentially of one or more Group III-V compound semiconductors having a composition defined by the formula $Al_{X1} Ga_{X2} In_{X3} As_{Y1} P_{Y2} N_{Y3} Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 12 may also be comprised of Group II-VI compound semiconductors having a composition $Zn_{A1} Cd_{A2} Se_{B1} Te_{B2}$, where A1, A2, B1, and B2 are relative proportions each greater than or equal to zero and A1+A2+B1+B2=1 (1 being a total mole quantity). Processes to provide substrate 12, as illustrated and described, are well known in the art. In an embodiment of the present invention, substrate 12 may be a silicon substrate. In another embodiment, substrate 12 may comprise a p-type doped substrate. Examples of p-type dopants include but are not limited to boron (B), indium (In), and gallium (Ga). In another embodiment, substrate 12 may comprise a p-type doped silicon substrate.

Substrate 12 may have embedded therein n-well 14 and p-well 20. Both n-well 14 and p-well 20 may be relatively weakly doped. In an embodiment, a phosphorus doping material may be used for n-well 14. In another embodiment, a boron doping material may be used for p-well 20. P-well 20 may abut n-well 14 and abut deep n-region 16. Deep n-region 16 may be located between p-well 20 and substrate 12. Deep n-region 16 may also partially extend beneath n-well 14. N-well 14 may include n-well contact 18 and p-well 20 may include p-well contact 24 thereon respectively. N-well contact 18 and p-well contact 24 may be separated by shallow trench isolation (STI) 36.

N-channel 26 may abut p-well 20 and p-region 22 may be located between n-channel 26 and deep n-region 16. As depicted, p-region 22 may be isolated from substrate 12 by deep n-region 16. N-channel 26 may also be separated from n-well 14 by p-well 20 and may include a p-doped gate 30 thereon. In an embodiment, p-doped gate 30 may comprise silicon.

JFET 10 may operate on an n-channel depletion mode with p-region 22 acting as a bottom gate and p-doped gate 30 acting as a top gate to pinch a current that may flow through n-channel 26. N-doped enhancement regions 32 and 34 may be within n-channel 26 and may be separated from p-doped gate 30 by STI 36. N-doped enhancement regions 32 and 34 may also abut and partially extend laterally underneath STI 36. N-doped enhancement regions 32 and 34 may also include thereon n-channel contacts 28 and 29, respectively. In an embodiment, n-channel contacts 28 and 29 may act as a source region and a drain region, respectively. JFET 10 may have a drain to source breakdown performance of approximately 10 V or greater.

In an embodiment, n-doped enhancement regions 32 and 34 may have a lower resistance than n-channel 26 and may enhance n-channel 26 resistance by lowering a link or a series resistance due to the additional n-type dopant. Additionally, an out-diffusion into n-channel 26 may create a doping gradient, i.e., a change in the rate of the doping concentration that may result in an increase in a p-n junction breakdown voltage. N-channel 26 may have a resistance-on value in a range from approximately 0.3 Ohm-cm to approximately 1 Ohm-cm. N-channel 26 may also have a voltage-off value in a range from approximately −2.0 Volts to approximately −4.0 Volts.

Embodiments of JFET structures described herein may be used with integrated circuit chips that may be distributed by a fabricator in a raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

Figure 2:
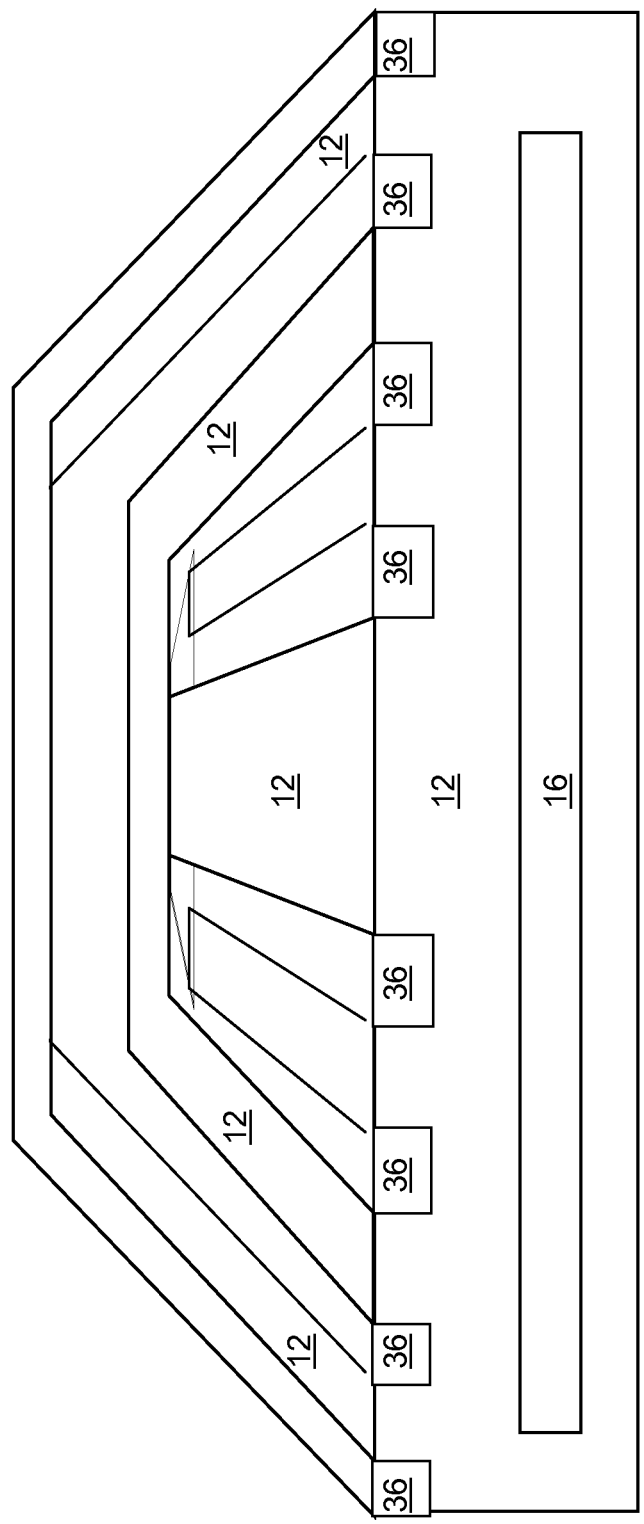
FIG. 2 depicts a step of an embodiment of a method for forming a JFET, in accordance with the present invention.

An embodiment of steps of a method for forming a JFET 10 are shown in FIGS. 2-10, in accordance with the present invention. Referring to FIG. 2, a substrate 12 comprising silicon, silicon-on-insulator, silicon germanium, or gallium arsenide may be provided. Various embodiments of substrate 12 have been previously described herein. In an embodiment, substrate 12 may be a doped p-type silicon substrate. Silicon substrate 12 may have a thickness in a range from approximately 2 μm to approximately 20 μm. In an embodiment, silicon substrate 12 may have a thickness of approximately 2 μm.

A deep n-region 16 may be formed in substrate 12 by depositing a photoresist (not shown) over the substrate 12 and patterning the photoresist to form a patterned mask (not shown) having a pattern of deep n-region 16. A conventional doping may be performed, for example, an ion implantation of a conducting dopant into substrate 12, while the patterned mask protects other portions of substrate 12. The implantation may include angled implantation so as to ensure the conducting dopant is implanted deep enough into substrate 12. The implanted dopants may diffuse into substrate 12 to a depth of approximately 1 μm to approximately 10 μm. In an embodiment, the conducting dopants may be n-type. The patterned mask may then be removed.

After formation of deep n-region 16, trench structures (not shown) may then be formed in substrate 12 by conventional processes known in the art for forming trench structures, for example, lithographic and/or etch processes. The trench structures may then be filled with a conventional oxide to form shallow trench isolation (STI) structures 36. Examples of an oxide material may include but is not limited to tetraethyl orthosilicate.

Figure 3:
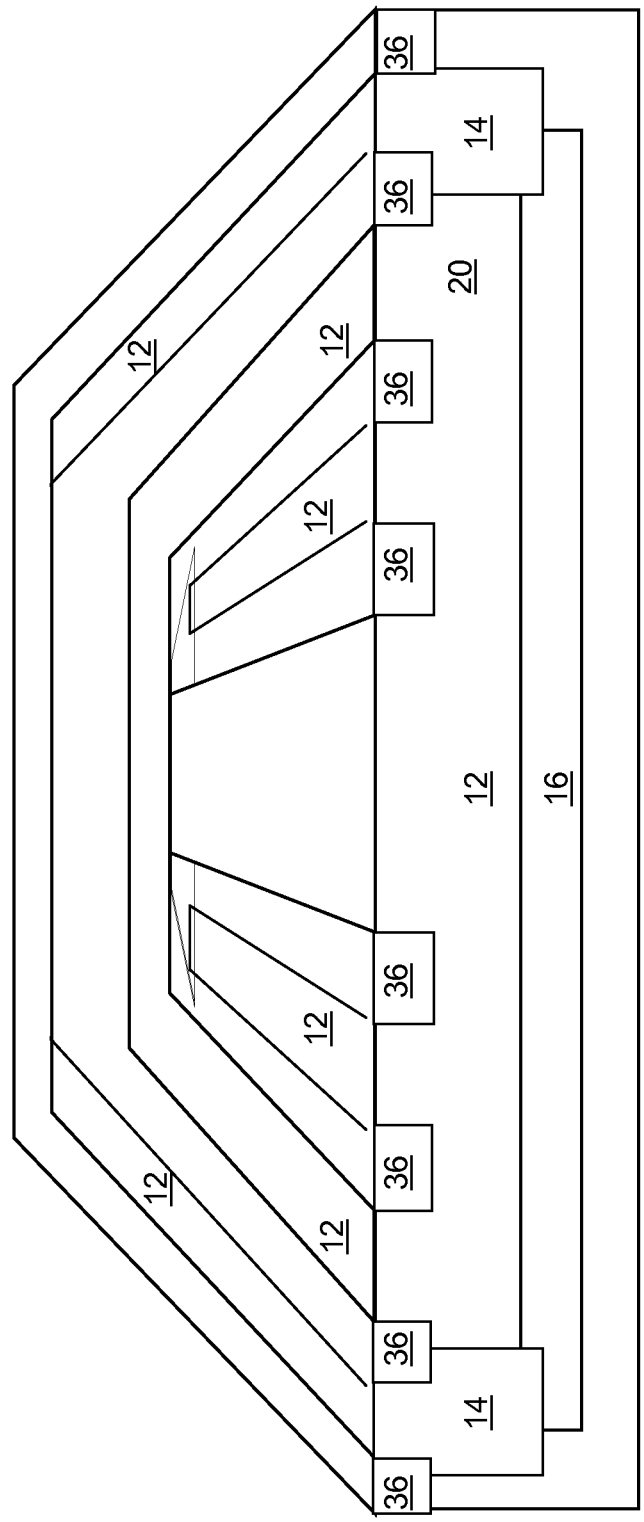
FIG. 3 depicts another step of an embodiment of a method for forming a JFET, in accordance with the present invention.

Referring to FIG. 3, an N-well 14 may be conventionally formed in substrate 12 by depositing a photoresist (not shown) over the structure of FIG. 2 and patterning the photoresist to form a patterned mask (not shown) having a pattern of N-well 14. N-well 14 may be in contact with edges of STI 36 and partially limited on two sides by STI 36. To ensure good contact with deep n-region 16, n-well may be formed at edges of and abut deep n-region 16. After formation of n-well 14, the patterned mask may be removed.

Figure 4:
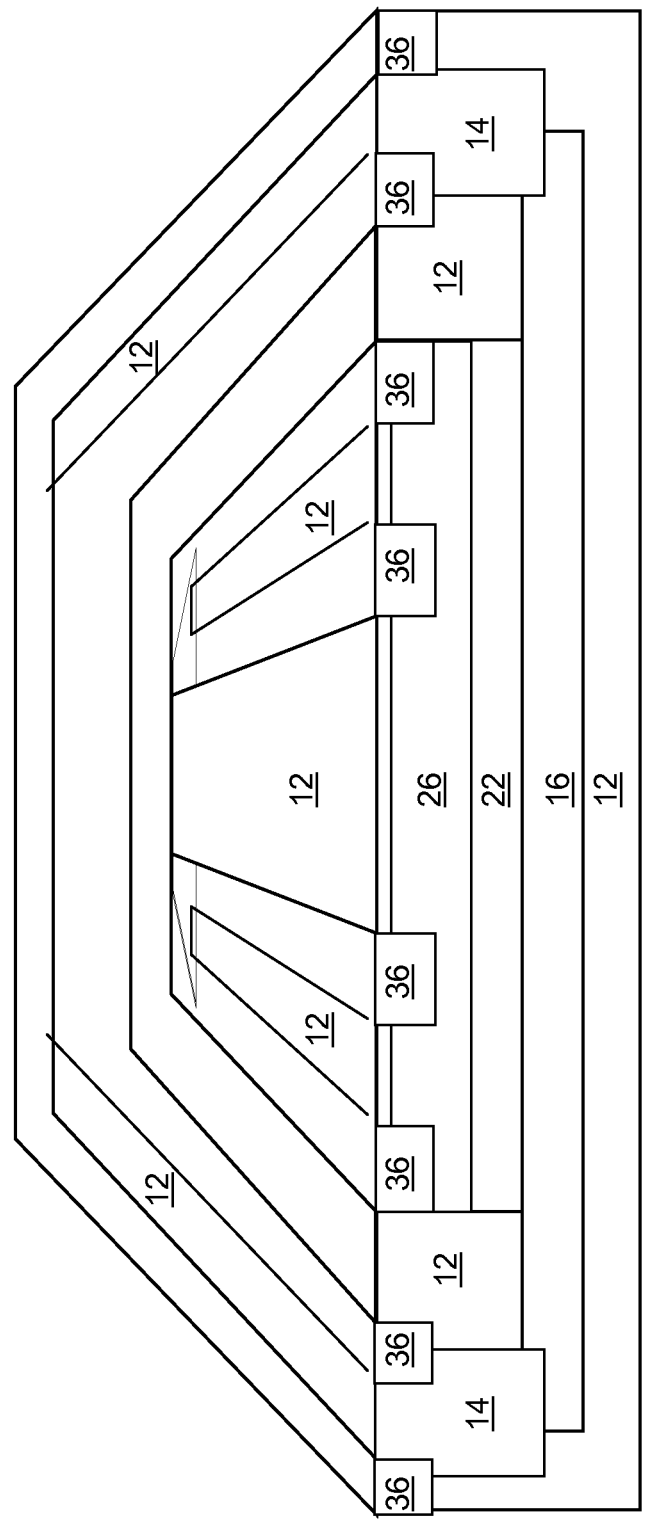
FIG. 4 depicts another step of an embodiment of a method for forming a JFET, in accordance with the present invention.

Referring to FIG. 4, a p-region 22 and a n-channel 26 may be formed on deep n-region 16, respectively, wherein p-region 22 may be located between n-channel 26 and deep n-region 16. N-channel 26 may be located within substrate 12 and on p-region 22. P-region 22 and n-channel may be formed by using one patterned mask where p-region 22 is first implanted using a p-type dopant followed by implantation of n-channel 26 using an n-type dopant.

Figure 5:
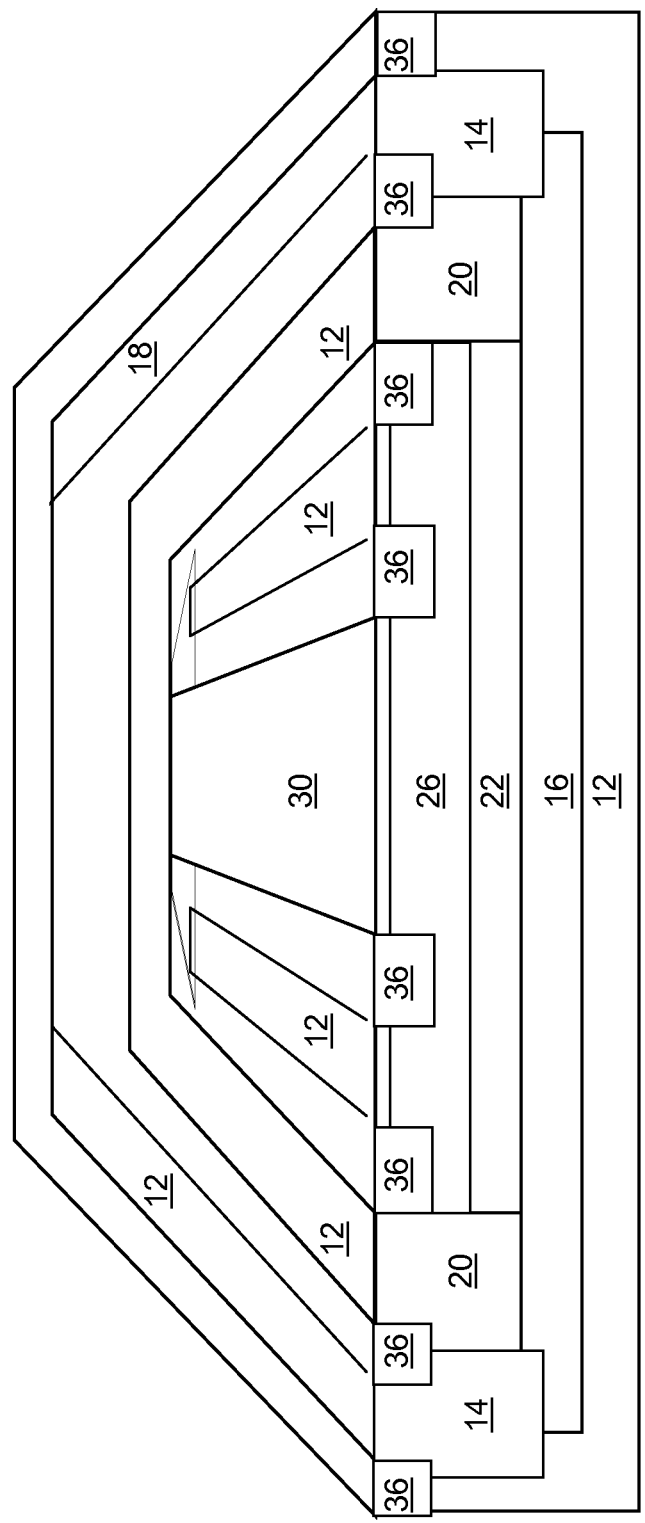
FIG. 5 depicts another step of an embodiment of a method for forming a JFET, in accordance with the present invention.

Referring to FIG. 5, a p-well 20 may be conventionally formed in substrate 12 by patterning a mask (not shown) over the structure of FIG. 4 and then performing an ion implantation of a conducting dopant through the mask pattern into substrate 12. The implantation may include angled implantation so as to ensure the conducting dopant is implanted deep enough into substrate 12. In an embodiment, the conducting dopants may be n-type.

P-well 20 may be partially limited on two sides by STI 36. P-well 20 may also be defined by an edge of p-region 22 and n-channel 26, and may abut n-well 14 and deep n-region 16. After formation of p-well 20, the mask may be removed by conventional processes known in the art. One having ordinary skill in the art will recognize without undue experimentation alternative conventional processes that may be used for forming p-well 20 in substrate 12.

Figure 6:
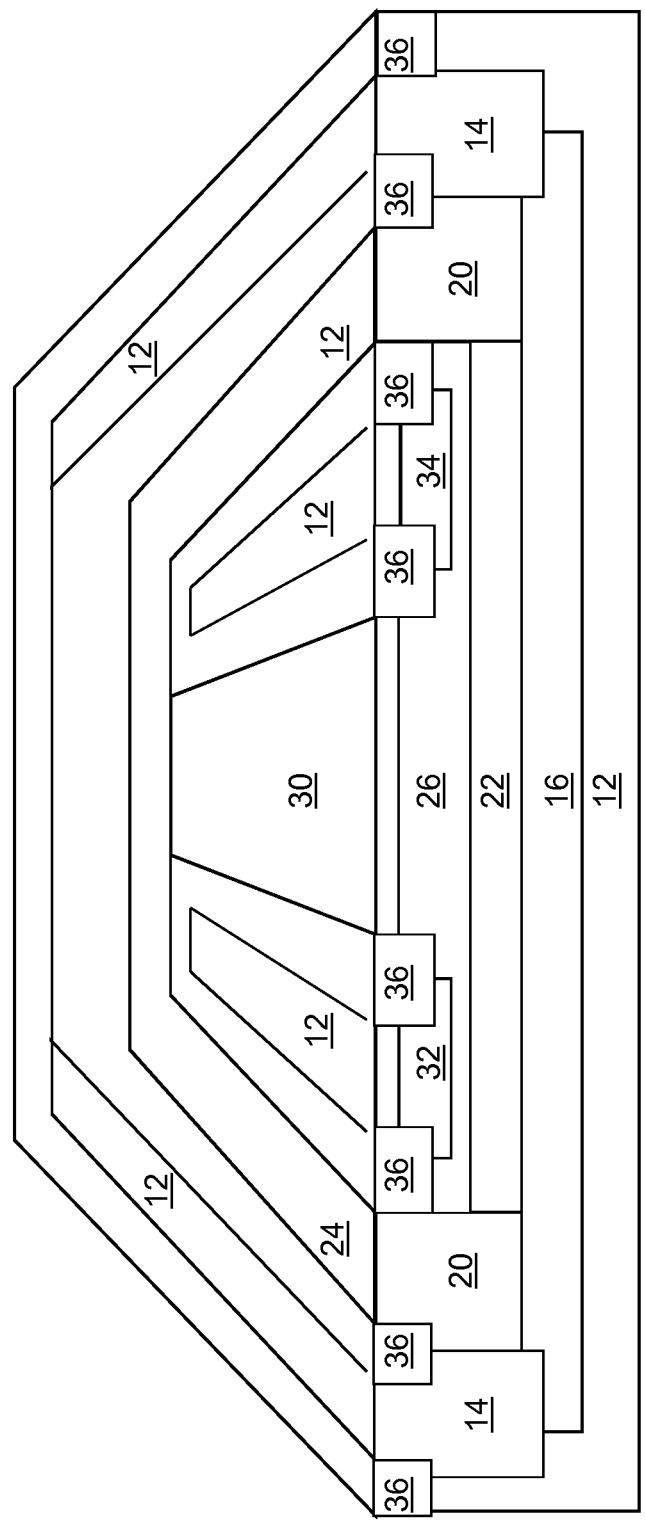
FIG. 6 depicts another step of an embodiment of a method for forming a JFET, in accordance with the present invention.

Referring to FIG. 6, enhancement regions 32 and 34 may be formed via conventional ion implantation by patterning a mask (not shown) over the structure of FIG. 5 and then performing an ion implantation through the mask pattern. One having ordinary skill in the art will recognize without undue experimentation that the ion diffusion may be controlled by varying energy, ion dose, and implantation tilt angle.

Figure 7:
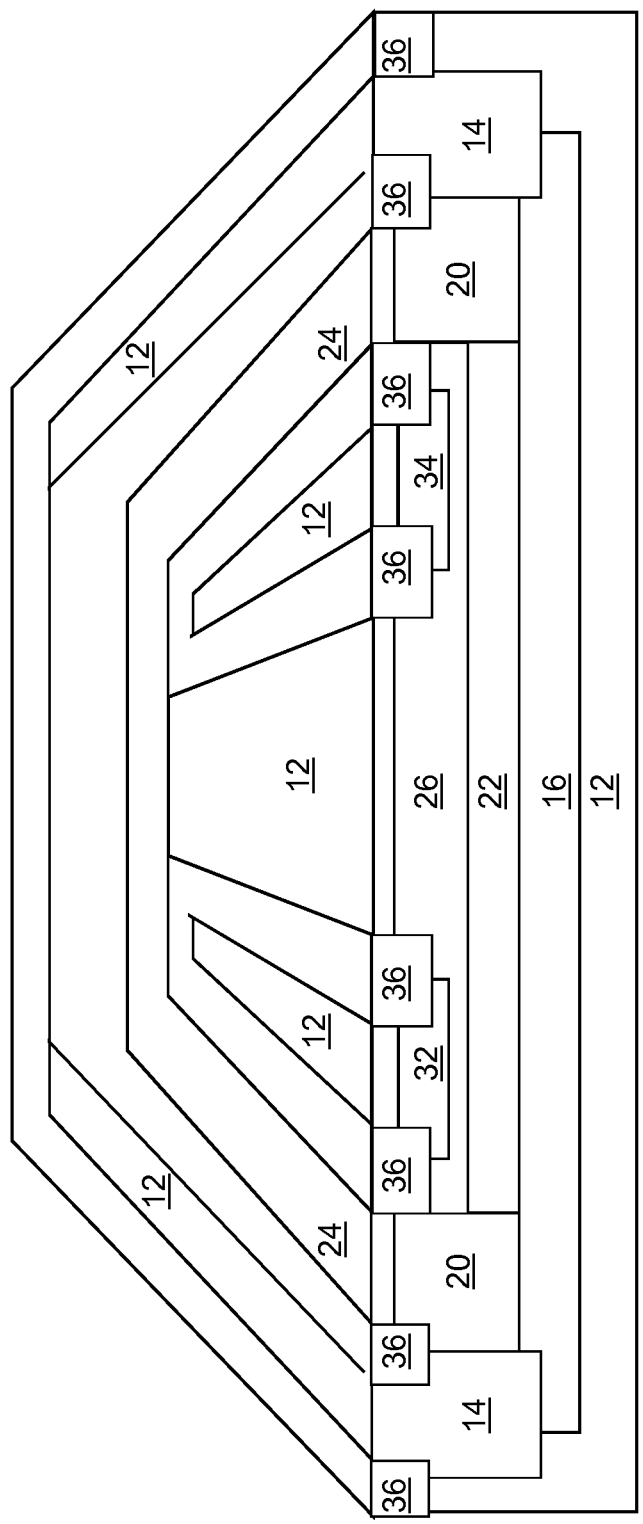
FIG. 7 depicts another step of an embodiment of a method for forming a JFET, in accordance with the present invention.

Referring to FIG. 7, a p-well contact 24 may be conventionally formed on p-well 20 by depositing a photoresist (not shown) over the structure of FIG. 6 and patterning the photoresist to form a patterned mask (not shown) having a pattern of p-well contact 24. Methods of depositing a photoresist and forming a patterned mask are known in the art. In an embodiment, a conventional, high-density, shallow doping may be performed to form p-well contact 24 having p+ dopants on p-well 20, while the photoresist protects other portions of the structure. The patterned mask may then be removed by conventional processes known in the art such as, for example, a diluted HF stripping process. One having ordinary skill in the art will recognize without undue experimentation alternative conventional processes that may be used for forming p-well contact 24 on p-well 20.

Figure 8:
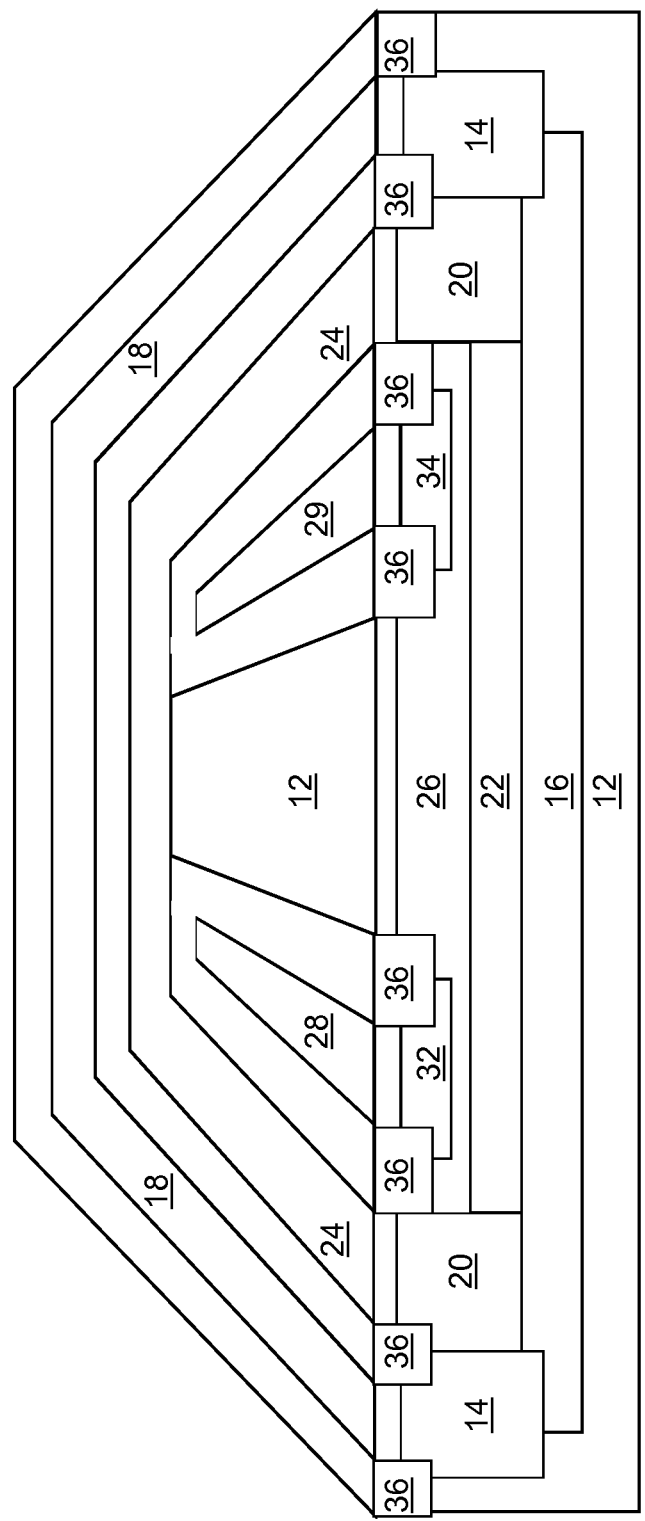
FIG. 8 depicts another step of an embodiment of a method for forming a JFET, in accordance with the present invention.

Referring to FIG. 8, a n-well contact 18, and n-channel contacts 28 and 29 may be formed on n-well 14 and n-channel 26, respectively, and similarly to the formation of p-well contact 24. A photoresist (not shown) may be deposited over the structure of FIG. 7 and then patterned to form a patterned mask (not shown) having a pattern of n-well contact 18, and n-channel contacts 28 and 29. Methods of depositing a photoresist and forming a patterned mask are known in the art. In an embodiment, a conventional, high-density, shallow doping may be performed to form n-well contact 14, and n-channel contacts 28 and 29 having n+ dopants on n-well 14 and n-channel 26 respectively, while the photoresist protects other portions of the structure. The patterned mask may then be removed by conventional processes known in the art such as, for example, a diluted HF stripping process. One having ordinary skill in the art will recognize without undue experimentation alternative conventional processes that may be used for forming n-well contact 18, and n-channel contacts 28 and 29.

Figure 9:
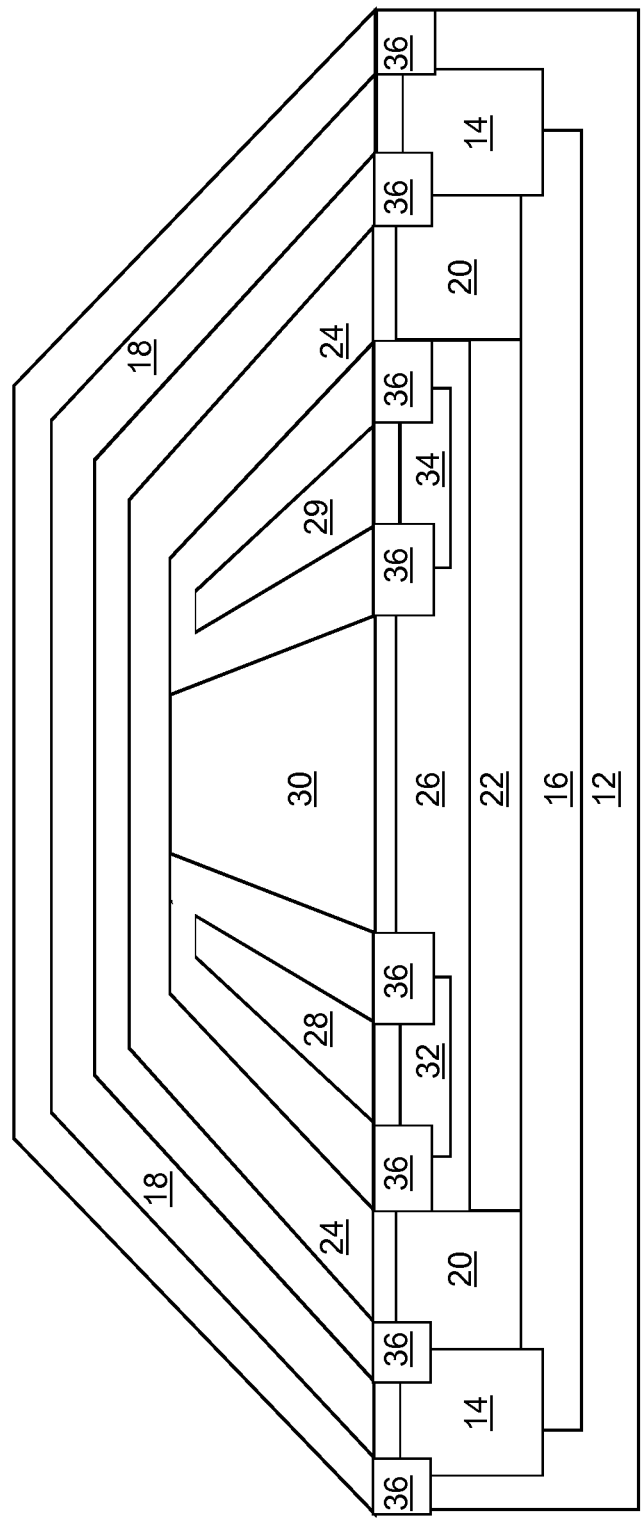
FIG. 9 depicts another step of an embodiment of a method for forming a JFET, in accordance with the present invention.

Referring to FIG. 9, a p-doped silicon gate 30 may be formed in n-channel 26. A photoresist (not shown) may be deposited over the structure of FIG. 8 and then patterned to form a patterned mask (not shown) having a pattern of p-doped silicon gate 30. Methods of depositing a photoresist and forming a patterned mask are known in the art. In an embodiment, a conventional, high-density, shallow doping may be performed to form p-doped silicon gate 30 having p dopants, while the photoresist protects other portions of the structure. The patterned mask may then be removed by conventional processes known in the art such as, for example, a diluted HF stripping process. One having ordinary skill in the art will recognize without undue experimentation alternative conventional processes that may be used for forming p-doped silicon gate 30.

The method steps described herein and the order in which they are described are not meant to be limiting. One having ordinary skill in the art will recognize without undue experimentation that the methods steps described herein may be performed in a different order resulting in the formation of the field effect transistor structures described herein.

The methods as described herein may be used in the fabrication of integrated circuit chips.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A junction gate field effect transistor (JFET) comprising:
a p-type substrate having a p-region therein;
an n-channel over the p-region;
a p-well abutting each of the n-channel and the p-region; and
n-doped enhancement regions within the n-channel, each n-doped enhancement region separated from the p-region,
wherein the p-well abuts each of an n-well and a deep n-region, the deep n-region being disposed between the p-well and the p-type substrate,
wherein the deep n-region abuts the n-well,
wherein the n-channel is distinct from the n-well, and
wherein the p-well is disposed between the n-well and the n-channel, and the p-well separates the n-well from the n-channel.

2. The JFET according to claim 1, wherein the n-doped enhancement regions have a lower resistance than the n-channel.

3. The JFET according to claim 1, wherein the n-channel has a resistance-on value in a range from 0.3 Ohm-cm to 1 Ohm-cm.

4. The JFET according to claim 1, wherein the n-channel has a voltage-off value in a range from −2.0 Volts to −4.0 Volts.

5. The JFET according to claim 1, wherein an out-diffusion into the n-channel creates a doping gradient having an increase in a p-n junction breakdown voltage.

6. The JFET according to claim 1, additionally comprising a p-doped gate on the n-channel.

7. The JFET according to claim 6, wherein the n-doped enhancement regions are each separated from the p-doped gate by a shallow trench isolation.

8. The JFET according to claim 7, additionally comprising n-channel contacts on the n-doped enhancement regions, wherein the n-channel contacts are separated from the p-doped gate and separated from p-well contacts by shallow trench isolations.

9. The JFET according to claim 6, wherein the n-channel is directly under the p-doped gate and directly over the p-region.

10. The JFET according to claim 1, wherein the p-region is directly under the n-channel and directly over the deep n-region.

11. A junction gate field effect transistor (JFET) comprising:
    a p-type substrate having an n-well therein;
    a p-well abutting the n-well and abutting a deep n-region of the n-well, wherein the deep n-region is between the p-well and the substrate, and abuts the n-well;
    an n-channel abutting the p-well and on a p-region of the p-well, wherein the p-region is between the n-channel and the deep n-region, wherein the n-channel is distinct from the n-well and the p-well is disposed between the n-well and the n-channel;
    a p-doped gate on the n-channel;
    n-doped enhancement regions within the n-channel, each n-doped enhancement region separated from the p-doped gate by a shallow trench isolation;
    an n-well contact on the n-well;
    a p-well contact on the p-well and in contact with the p-doped gate; and
    n-channel contacts on the n-doped enhancement regions, wherein the n-channel contacts are each separated from the p-doped gate and separated from the p-well contact by a shallow trench isolation.

12. The JFET according to claim 11, the n-doped enhancement regions have a lower resistance than the n-channel.

13. The JFET according to claim 11, wherein the n-channel has a resistance-on value in a range from 0.3 Ohm-cm to 1 Ohm-cm.

14. The JFET according to claim 11, wherein the n-channel has a voltage-off value in a range from −2.0 Volts to −4.0 Volts.

15. The JFET according to claim 11, wherein the n-doped enhancement regions enhance the n-channel resistance-on.

16. The JFET according to claim 11, wherein a drain to source breakdown performance is 10 Volts or greater.

17. The JFET according to claim 11, wherein the n-channel contacts act as a source region and a drain region respectively.

18. The JFET according to claim 11, wherein the n-doped enhancement regions partially extend underneath the shallow trench isolation.

19. The JFET according to claim 11, wherein an out-diffusion into the n-channel creates a doping gradient having an increase in a p-n junction breakdown voltage.

20. A junction gate field effect transistor (JFET) comprising:
    a p-type substrate having a p-region therein;
    an n-channel over the p-region;
    a p-doped gate on the n-channel; and
    n-doped enhancement regions within the n-channel, each n-doped enhancement region separated from the p-region, wherein the n-doped enhancement regions are each separated from the p-doped gate by a shallow trench isolation;
    a p-well abutting the p-region and the n-channel;
    a deep n-region directly below and in contact with the p-region, the deep n-region abutting the n-well and the p-well; and
    an n-well abutting the p-well, the n-well and the n-channel being separated from one another by the p-well.

* * * * *